(12) United States Patent
Tsumura

(10) Patent No.: US 10,860,046 B2
(45) Date of Patent: Dec. 8, 2020

(54) REFERENCE VOLTAGE GENERATION DEVICE

(71) Applicant: ABLIC Inc., Chiba (JP)

(72) Inventor: Kazuhiro Tsumura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/690,761

(22) Filed: Nov. 21, 2019

(65) Prior Publication Data

US 2020/0192412 A1    Jun. 18, 2020

(30) Foreign Application Priority Data

Dec. 12, 2018   (JP) ................................. 2018-232169

(51) Int. Cl.
*G05F 3/26* (2006.01)
*H01L 27/088* (2006.01)

(52) U.S. Cl.
CPC .......... *G05F 3/262* (2013.01); *H01L 27/0883* (2013.01)

(58) Field of Classification Search
None
See application file for complete search history.

(56) References Cited

U.S. PATENT DOCUMENTS

| 4,868,416 | A | * | 9/1989 | Fitzpatrick | ................ | G05F 3/24 327/541 |
| 4,994,688 | A | * | 2/1991 | Horiguchi | ............... | G05F 1/465 323/314 |
| 5,514,948 | A | * | 5/1996 | Okazaki | ................. | G05F 3/262 323/314 |
| 2011/0156822 | A1 | * | 6/2011 | Takano | .................... | G05F 3/242 331/57 |
| 2014/0240038 | A1 | * | 8/2014 | Yoshino | .................... | G05F 3/24 327/541 |
| 2016/0225779 | A1 | * | 8/2016 | Harada | ............. | H01L 21/76202 |
| 2018/0248353 | A1 | * | 8/2018 | Creech | ..................... | H02H 3/08 |

FOREIGN PATENT DOCUMENTS

JP    2014-186714 A    10/2014

* cited by examiner

*Primary Examiner* — Lincoln D Donovan
*Assistant Examiner* — Khareem E Almo
(74) *Attorney, Agent, or Firm* — Brinks Gilson & Lione

(57) ABSTRACT

A reference voltage generation device (100) includes a constant current circuit (101) configured to output a constant current; and a plurality of voltage generation circuits (102) each configured to generate an output voltage based on the constant current, wherein the constant current has a correlation represented by a first gradient with respect to a temperature change, and wherein a plurality of the output voltages from the plurality of voltage generation circuits (102) have correlations represented by second gradients that are inverse to the correlation represented by the first gradient with respect to the temperature change and have different gradient indices. The reference voltage generation device (100) is configured to generate a reference voltage based on the constant current and the output voltage of at least one voltage generation circuit selected from the plurality of voltage generation circuits.

7 Claims, 14 Drawing Sheets

REFERENCE VOLTAGE GENERATION DEVICE

RELATED APPLICATIONS

This application claims priority to Japanese Patent Application No. 2018-232169 filed on Dec. 12, 2018, the entire content of which is incorporated herein by reference.

BACKGROUND OF THE INVENTION

1. Field of the Invention

The present invention relates to a reference voltage generation device.

2. Description of the Related Art

Along the spread of IoT in the future, the range of the operating temperature of an IC (Integrated Circuit) is expected to expand as ICs are installed in various products. In an IC including a reference voltage generation device, change in reference voltage provided from the reference voltage generation device is desired to be small against temperature change in order to suppress malfunction caused by the temperature change.

Reference voltage generation device having a configuration in which a constant current from a constant current circuit is supplied to a voltage generation circuit to generate a constant reference voltage based on the magnitude of the constant current is commonly used in ICs. In a reference voltage generation device having such configuration, variation in characteristics due to temperature change (hereinafter referred to as "temperature-related variation") of the constant current circuit and that of the voltage generation circuit are made equal to cancel them out so that the temperature-related variation of the reference voltage is suppressed.

In a conventional reference voltage generation device, a technology is known in which, in order to reduce variation in reference voltage due to temperature change (hereinafter referred to as "temperature-related variation of the reference voltage") which is caused by variation in manufacturing steps, a plurality of unit reference voltage generation devices are provided so that an optimal unit reference voltage generation device can be selected through evaluation of electrical characteristics.

Further, a related-art unit reference voltage generation circuit is constituted from an enhancement N-channel MOS transistor (hereinafter "N-channel MOS" is referred to as "NMOS") and a depletion NMOS transistor which have channel impurity regions of the same impurity concentration each other, and in which a difference in threshold voltages can be generated by changing polarities of gate electrodes. Even though an impurity concentration of a channel impurity region of a unit reference voltage generation device deviates away from the setting value by manufacturing variations, the temperature-related variation of the reference voltage is suppressed through selection of a separately-prepared unit reference voltage generation device having a channel impurity region of an impurity concentration that is close to the setting value (see Japanese Patent Application Laid-open No. 2014-186714, for example).

The reference voltage generation device described in Japanese Patent Application Laid-open No. 2014-186714 works in reducing the temperature-related variation of the reference voltage when the impurity concentration of the channel impurity region varies among semiconductor substrates, for example, due to the manufacturing variations.

However, the reference voltage generation device has a room for improvement in a case where manufacturing variations of impurity concentrations of the channel impurity regions occur in a local region in a semiconductor substrate so that the depletion MOS transistor and the enhancement MOS transistor in the unit reference voltage generation device differ in impurity concentrations having initially the same setting.

SUMMARY OF THE INVENTION

In view of the above, an object of the present invention is to provide a reference voltage generation device in which temperature-related variation of a reference voltage caused by variation of impurity concentration in the reference voltage generation device is reduced.

A reference voltage generation device according to an embodiment of the present invention has the following constitution.

A reference voltage generation device includes: a constant current circuit configured to output a constant current in response to an input voltage; and a plurality of voltage generation circuits each configured to generate an output voltage based on an input current, wherein the constant current output by the constant current circuit has a correlation represented by a first gradient with respect to a temperature change, wherein a plurality of the output voltages output by the plurality of voltage generation circuits have correlations of second gradients that are inverse to the correlation represented by the first gradient with respect to the temperature change and have different gradient indices, and wherein the reference voltage generation device is configured to generate a reference voltage based on the constant current and the output voltage of at least one voltage generation circuit selected from the plurality of voltage generation circuits.

According to the present invention, it is possible to provide a reference voltage generation device in which, through generation of the reference voltage based on an output voltage of at least one voltage generation circuit selected from a plurality of voltage generation circuits each having different gradient indices of temperature-related variation of output voltage, the temperature-related variation of the reference voltage is reduced for the variations of the impurity concentrations in the reference voltage generation device.

DETAILED DESCRIPTION OF THE PREFERRED EMBODIMENTS

Before explaining embodiments of the present invention, in order to facilitate understanding of the embodiments, referring to a related-art reference voltage generation device, a description is given of an increase in temperature-related variation of a reference voltage which is caused by variation in impurity concentration of a channel impurity region of a MOS transistor in a local region of a semiconductor substrate.

Figure 12:
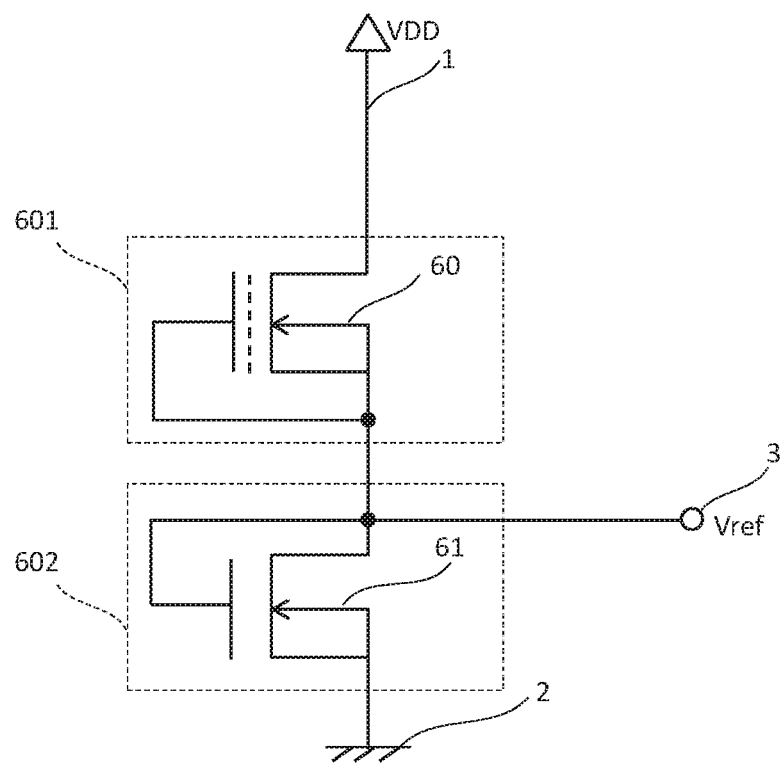
FIG. 12 is a circuit diagram for illustrating a related-art reference voltage generation device.
Figure 13:
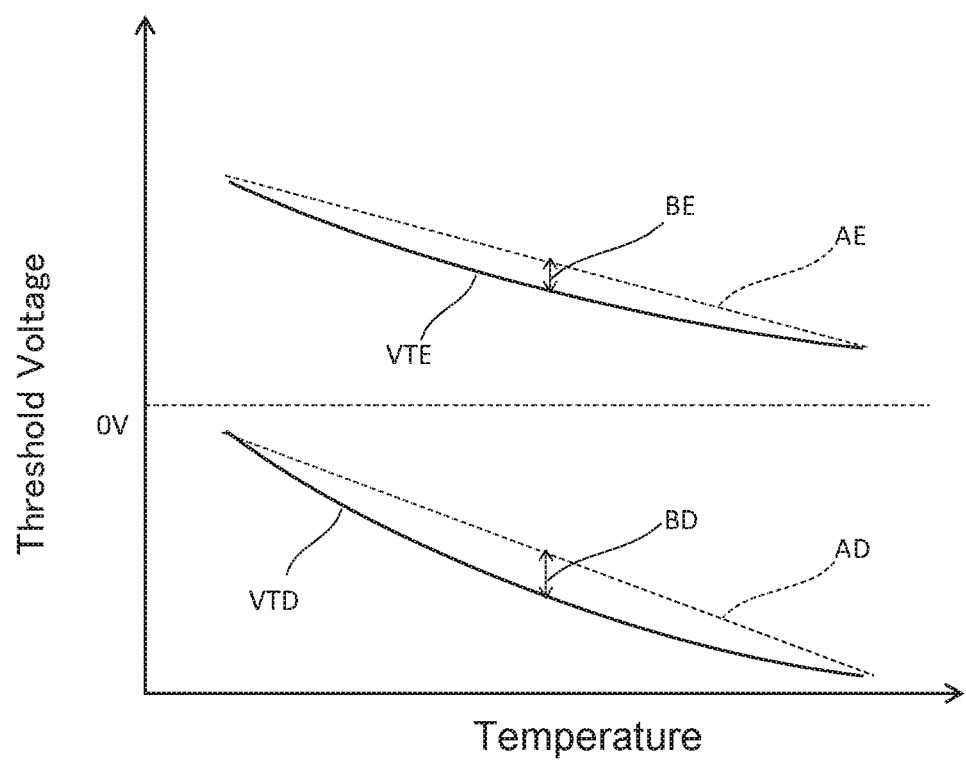
FIG. 13 is a schematic graph for showing temperature characteristics of threshold voltages of an enhancement NMOS transistor and a depletion NMOS transistor.

FIG. 12 shows a conventional reference voltage generation device 600 in a related art in which the threshold voltage VTD of a depletion NMOS transistor 60 forming a constant current circuit 601 and the threshold voltage VTE of an enhancement NMOS transistor 61 forming a voltage generation circuit 602 can be expressed as approximate equations by Expressions (1) and (2) below with respect to temperature T. As shown in FIG. 13, each of these threshold voltages has a tendency of a monotonously decreasing gradient that draws a downwardly convex arc with respect to the temperature T.

$$VTD \approx VTD0 + AD \cdot T + BD \cdot T^2 \quad (1)$$

$$VTE \approx VTE0 + AE \cdot T + BE \cdot T^2 \quad (2)$$

In Expressions (1) and (2), AD and AE are approximate 1st-order coefficients that show degree of linear changes with respect to the temperature T, and correspond to linear gradients in the characteristics of FIG. 13. Further, BD and BE are approximate 2nd-order coefficients that show non-linear change with respect to the temperature T, and correspond to downward convex degrees in the characteristics of FIG. 13. Further, VTD0 and VTE0 are constants that are independent of the temperature T.

Now an approximate 1st-order coefficient and an approximate 2nd-order coefficient indicating temperature-related variation of threshold voltages are called collectively as a gradient index, and each of other gradient indices to be described below also includes an approximate 1st-order coefficient and an approximate 2nd-order coefficient. Accordingly, the temperature-related variation of a constant current supplied from the constant current circuit 601 based on the threshold voltage VTD and an output voltage provided from the voltage generation circuit 602 based on the threshold voltage VTE also have gradient indices each expressed by the approximate 1st-order coefficient and the approximate 2nd-order coefficient.

A reference voltage Vref generated from the reference voltage generation device 600 is provided from a reference voltage terminal 3 after the gradient indices of the constant current supplied from the constant current circuit 601 and the output voltage provided from the voltage generation circuit 602 cancelled out. However, when the approximate 1st-order coefficients AD and AE or the approximate 2nd-order coefficients BD and BE do not match, the gradient indices do not completely cancel out, and as in Expression (3), the temperature-related variation of the reference voltage Vref follows an approximate equation including the gradient indices expressed by an approximate 1st-order coefficient A and an approximate 2nd-order coefficient B, and a constant Vref0 that is independent of the temperature T.

$$Vref \approx Vref0 + A \cdot T + B \cdot T^2 \quad (3)$$

Figure 14:
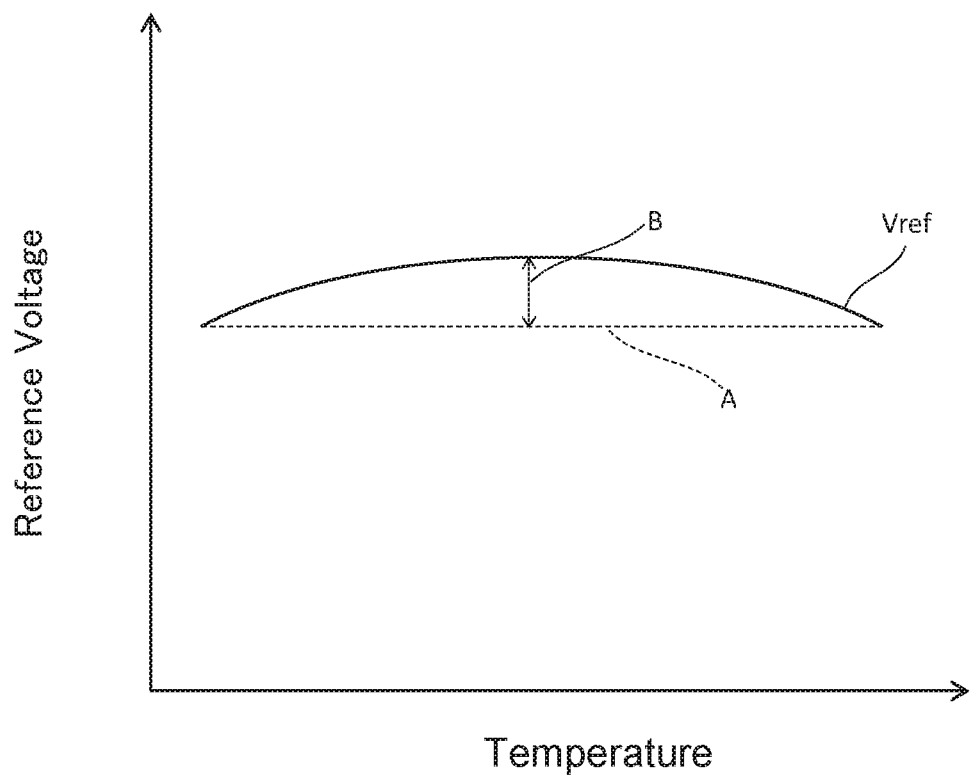
FIG. 14 is a schematic graph for showing temperature characteristics of a reference voltage output by the related-art reference voltage generation device.

In Expressions (1) and (2), AD and AE which affect the approximate 1st-order coefficients in the temperature-related variation of the constant current supplied from the constant current circuit 601 and the output voltage provided from the voltage generation circuit 602 can be controlled by adjusting channel sizes (channel lengths and channel widths) of the depletion NMOS transistor 60 and the enhancement NMOS transistor 61. The approximate 1st-order coefficients AD and AE of the threshold voltages VTD and VTE can thereby match through optimization of the channel sizes. In this manner, the approximate 1st-order coefficient A in Expression (3) can be reduced, and a linear component in the temperature-related variation of the reference voltage Vref can be suppressed as shown in FIG. 14.

Meanwhile, it has been found in investigations by the inventor of the present invention that each of the approximate 2nd-order coefficients BD and BE, which are non-linear components of the characteristics, changes depending on impurity concentration of the channel impurity region of the MOS transistor and concentration distribution thereof. Hence in the reference voltage generation device formed of the enhancement NMOS transistor and the depletion MOS transistor having different polarity of the gate electrodes and having the same impurity concentration of channel impurity regions as in FIG. 1 of Japanese Patent Application Laid-open No. 2014-186714 the approximate 2nd-order coefficients BD and BE in the temperature-related variation of the threshold voltages VTD and VTE cancel out. With the reduction of the approximate 2nd-order coefficient B in Expression (3), reduction in temperature-related variation of the reference voltage Vref can thus be achieved. However, when the impurity concentration of the channel impurity region of the enhancement NMOS transistor and of the depletion MOS transistor in the reference voltage generation device differ due to manufacturing variation, the approximate 2nd-order coefficients BD and BE in the temperature-related variation of the threshold voltages do not cancel out, and the approximate 2nd-order coefficient B of the reference voltage Vref becomes noticeable so that the reference voltage Vref becomes a curve that draws an arc as in FIG. 14. Based on such findings, the present invention has been made to reduce the temperature-related variation of the reference voltage caused by the manufacturing variation of the impurity concentration in the reference voltage generation device.

Now, descriptions are given of embodiments of a semiconductor device of the present invention with reference to the drawings. The drawings referred to in the following description may omit some parts for easier understanding of features of the present invention and may accordingly differ from the actual device.

First Embodiment

A reference voltage generation device according to the first embodiment of the present invention reduces the temperature-related variation of the reference voltage generated by the difference between the impurity concentration of the channel impurity regions, which are otherwise set to be the same concentration, in the reference voltage generation device caused by the manufacturing variation, for example.

Figure 1:
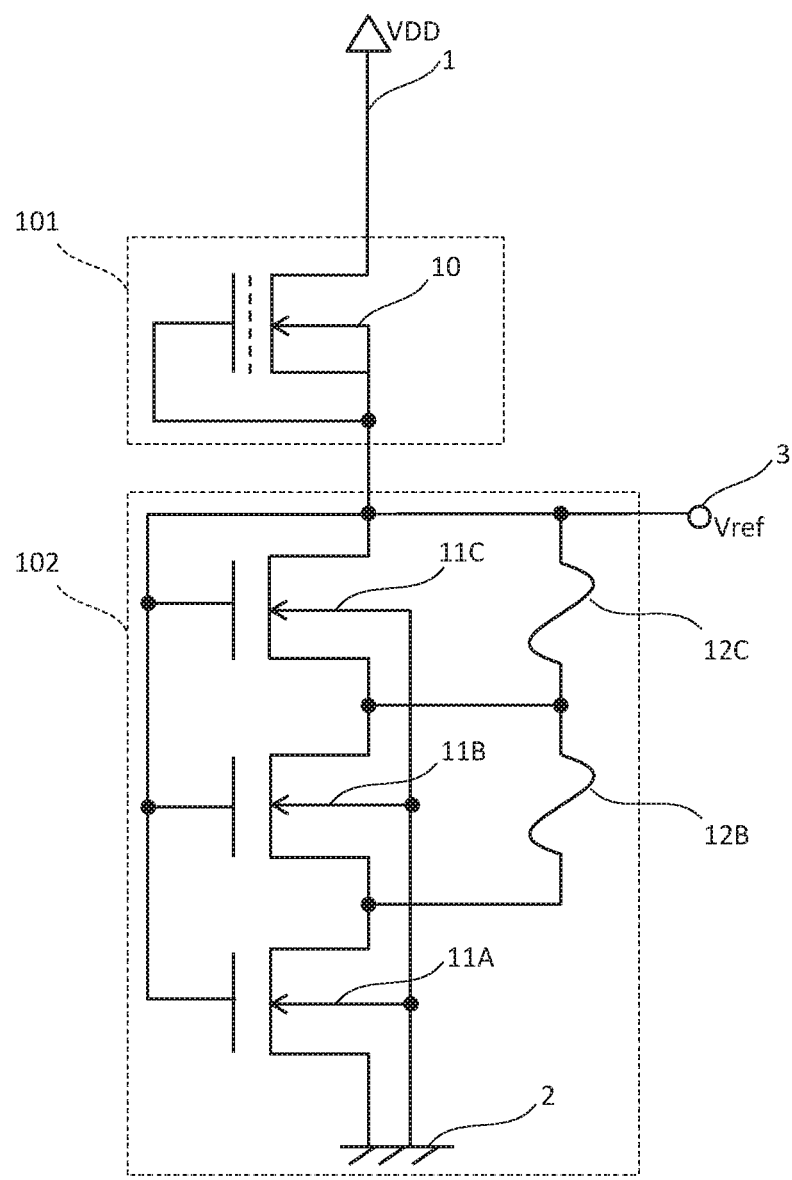
FIG. 1 is a circuit diagram for illustrating a reference voltage generation device according to a first embodiment of the present invention.

FIG. 1 is a circuit diagram for illustrating a reference voltage generation device 100 according to the first embodiment of the present invention. The reference voltage generation device 100 according to the first embodiment includes a constant current circuit 101 and a voltage generation circuit 102. The constant current circuit 101 which is connected to a power supply terminal 1 to be supplied with a power supply voltage VDD supplies a constant current independent of the power supply voltage VDD to the voltage generation circuit 102. The voltage generation circuit 102 receives the constant current supplied from the constant current circuit 101 and provides a reference voltage Vref based on the value of the constant current from the reference voltage terminal 3.

The constant current circuit 101 of FIG. 1 includes a depletion NMOS transistor 10 having an N-type gate electrode and an N-type channel impurity region and having a threshold voltage of less than 0 V. The depletion NMOS transistor 10 has a gate, a source, and a back gate connected to the reference voltage terminal 3 and has a drain connected to the power supply terminal 1. A constant current ID supplied from the depletion NMOS transistor 10 having the above-mentioned wire connection has a characteristic as shown by Expression (4) with the threshold voltage VTD of Expression (1) provided that a gate voltage is denoted by VG, and a mutual conductance is denoted by KD. Further, the threshold voltage VTD includes the approximate 1st-order coefficient AD and the approximate 2nd-order coefficient BD, and hence the constant current m can also be approximated by an expression including an approximate 1st-order coefficient AI and an approximate 2nd-order coefficient BD. In Expression (4), ID0 is a constant that is independent of the temperature T.

$$ID = KD \cdot (VG - VTD)^2 \approx ID0 + AI \cdot T + BI \cdot T^2 \qquad (4)$$

Figure 2:
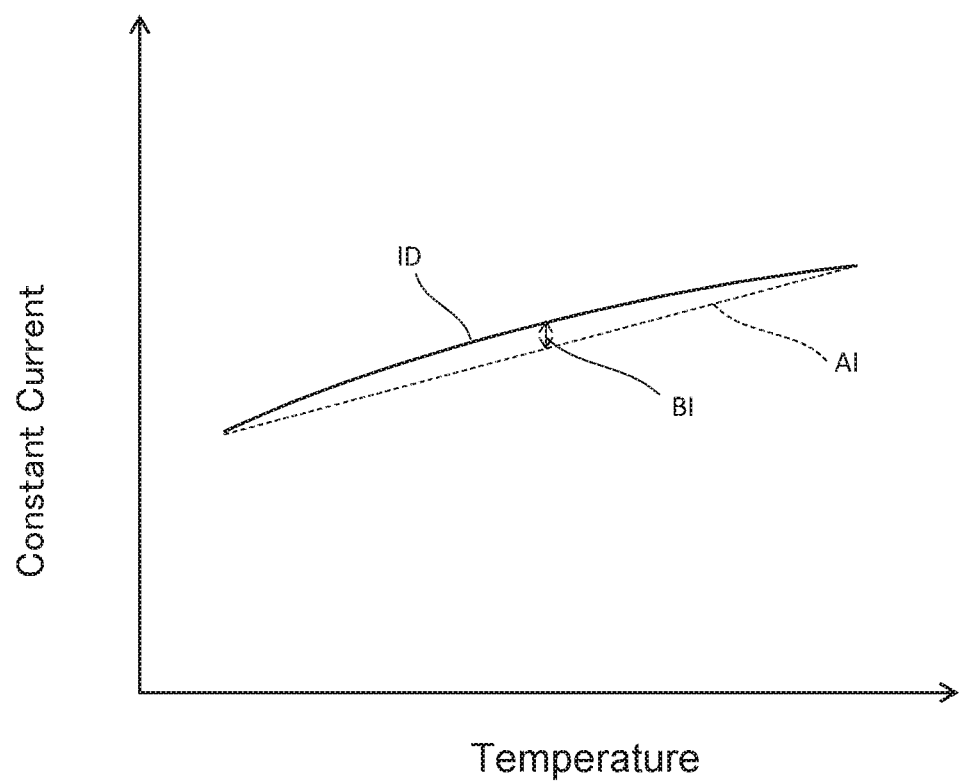
FIG. 2 is a schematic graph for showing temperature characteristics of a constant current output by a constant current circuit.

Tendency of the variation of the constant current ID with respect to temperature shows a correlation represented by the first gradient that increases with respect to the temperature with a gradient index including the approximate 1st-order coefficient AI and the approximate 2nd-order coefficient BI as shown in FIG. 2.

The voltage generation circuit 102 of FIG. 1 further includes a plurality of voltage generation circuits. For example, one of the voltage generation circuits is an enhancement NMOS transistor 11A including a P-type gate electrode and an N-type channel impurity region and having a threshold voltage of 0 V or more. Here, the impurity concentration NE of the channel impurity region of the enhancement NMOS transistor 11A is set to the same impurity concentration as the impurity concentration ND of the channel impurity region of the depletion NMOS transistor 10. Further, an enhancement NMOS transistor 11B including a channel impurity region having an impurity concentration that is higher than the impurity concentration NE, and an enhancement NMOS transistor 11C including a channel impurity region having an impurity concentration that is lower than the impurity concentration NE are connected in series to the enhancement NMOS transistor 11A. Gates of all the enhancement NMOS transistors 11A, 11B, and 11C and a drain of the enhancement NMOS transistor 11C are connected to the reference voltage terminal 3, and back gates of all the enhancement NMOS transistors 11A, 11B, and 11C are connected to the ground terminal 2. Further, a source of the enhancement NMOS transistor 11C is connected to a drain of the enhancement NMOS transistor 11B, a source of the enhancement NMOS transistor 11B is connected to a drain of the enhancement NMOS transistor 11A, and a source of the enhancement NMOS transistor 11A is connected to the ground terminal 2. An output voltage $VE_A$ provided from the drain of the enhancement NMOS transistor 11A having the above-mentioned wire connection has a characteristic as shown in Expression (5) with the threshold voltage VTE provided that a gate voltage is denoted by VG, and a mutual conductance is denoted by KE. In Expression (5), $VE_A 0$ is a constant that is independent of the temperature T.

$$VE_A =) IE/KE)^{1/2} + VTE \approx VE_A 0 + AV \cdot T + BV \cdot T^2 \qquad (5)$$

Figure 3:
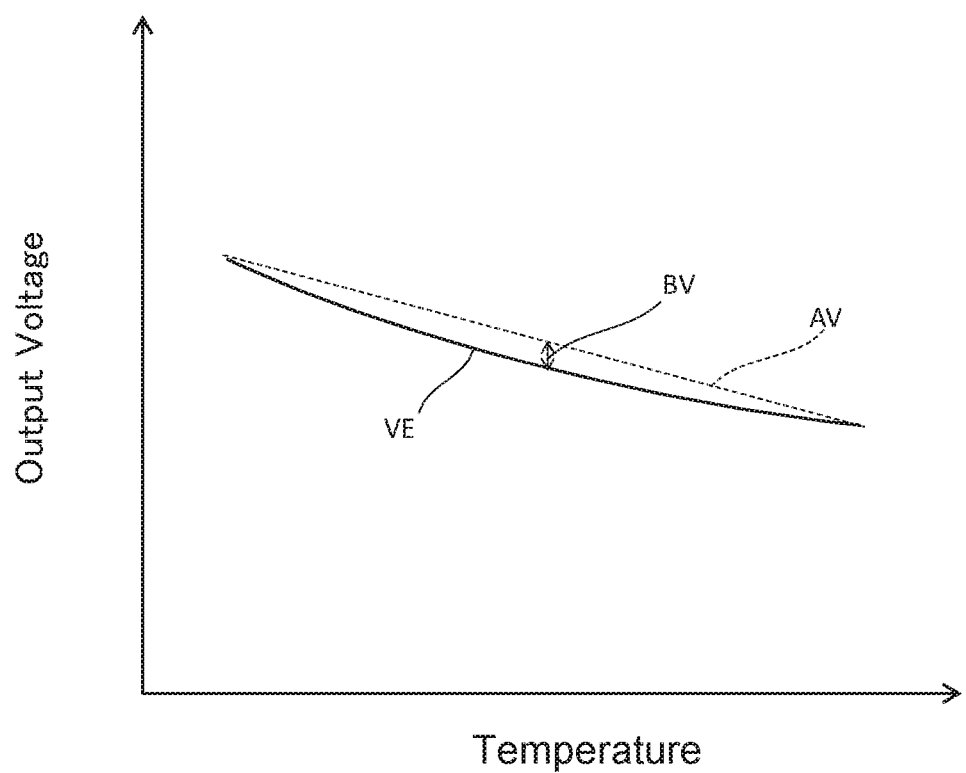
FIG. 3 is a schematic graph for showing temperature characteristics of an output voltage from a voltage generation circuit.

Each of the output voltages provided from the enhancement NMOS transistors 11A, 11B, and 11C shows a correlation represented by a negative gradient with respect to the temperature as shown in FIG. 3, and exhibits a temperature-related variation of an inverse gradient with respect to the correlation represented by a positive gradient of the constant current ID shown in FIG. 2. Further, the enhancement NMOS transistors 11A, 11B, and 11C include the channel impurity regions having the different impurity concentrations, and hence exhibit temperature-related variation of different gradient indices (approximate 2nd-order coefficients BI) depending on magnitudes of their impurity concentrations.

The reference voltage generation device 100 has a configuration in which, with the supply of the constant current having the gradient shown in FIG. 2 to the voltage generation circuit 102 having the gradient shown in FIG. 3, the gradients cancel out to reduce the temperature-related variation of the reference voltage Vref.

Between the source and the drain of each of the enhancement NMOS transistors 11B and 11C, each of fuses 12B and 12C is connected parallel to the NMOS transistor. The fuses 12B and 12C can be disconnected by laser or overcurrent, and an electrical short-circuit is established by each fuse between the source and the drain to stop functions of the enhancement NMOS transistors 11B and 11C before disconnection. By suitably disconnecting the fuses 12B and 12C, at least one enhancement NMOS transistor is selected to function from the plurality of enhancement NMOS transistors. In this manner, with state changes such as connection and disconnection of the fuses, the voltage provided from the reference voltage terminal 3 becomes any one of drain voltages $VE_A$, $VE_B$, and $VE_C$ of the enhancement NMOS transistors 11A, 11B, and 11C, or a voltage as a sum of the drain voltages $VE_A$, $VE_B$, and $VE_C$. Accordingly, the reference voltage Vref provided from the reference voltage terminal 3 also exhibits temperature characteristic based on any one of temperature characteristics of the drain voltages $VE_A$, $VE_B$, and $VE_C$, or temperature characteristic as the sum of the drain voltages $VE_A$, $VE_B$, and $VE_C$.

Next, a description is given of an example of a method of reducing the variation of the impurity concentration of the channel impurity region and the resulting temperature-related variation of the reference voltage provided from reference voltage generation device.

Figure 4:
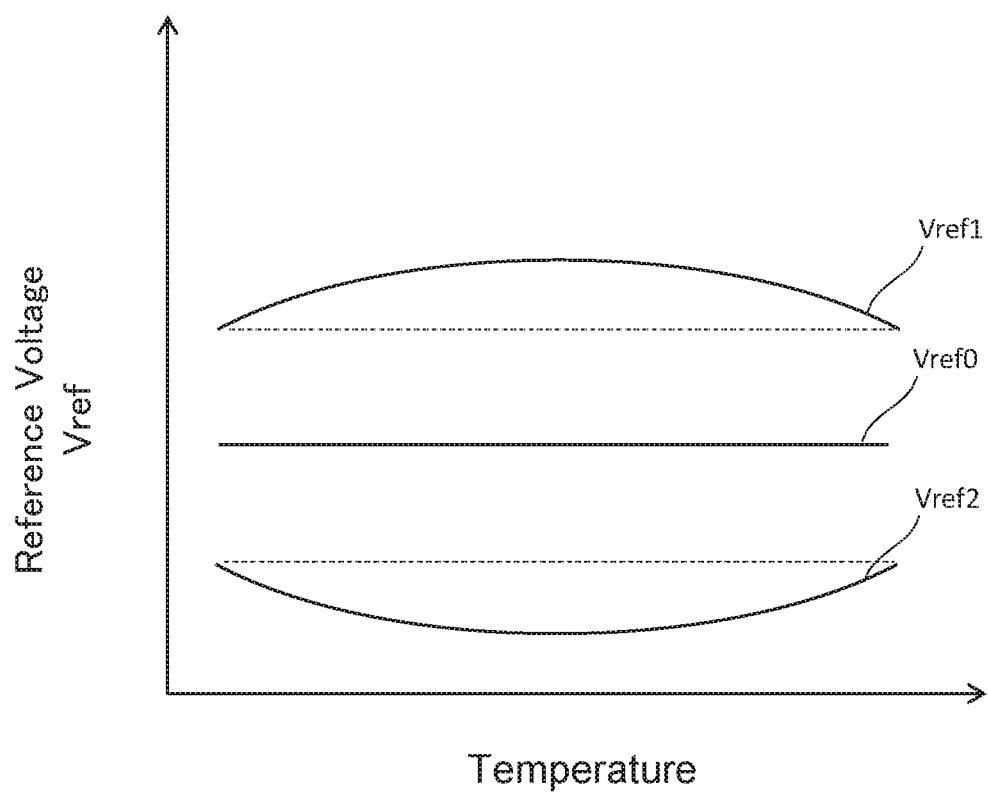
FIG. 4 is a schematic graph for showing temperature characteristics of reference voltages from the reference voltage generation device according to the first embodiment of the present invention.

The reference voltage Vref provided from the reference voltage generation device 100 including the depletion NMOS transistor 10 and the enhancement NMOS transistor 11A which are different in polarity of the gate electrodes and are the same in polarity of the channel impurity regions and in impurity concentrations ND and NE has a characteristic of reduced temperature-related variation with respect to the temperature as indicated by Vref0 of FIG. 4.

When the impurity concentration NE becomes higher than the impurity concentration ND due to the manufacturing variation, effects of the approximate 2nd-order coefficient BE in FIG. 13 and an approximate 2nd-order coefficient BV in FIG. 3 based on the approximate 2nd-order coefficient BE become larger. The reference voltage Vref thereby exhibits a characteristic that draws a downwardly convex arc as indicated by Vref2 shown in FIG. 4. The fuse 12C connected in parallel to the enhancement NMOS transistor 11C which has the impurity concentration NE that is lower than that of the enhancement NMOS transistor 11A and a small approximate 2nd-order coefficient of the threshold voltage with respect to the temperature is disconnected in FIG. 1 so that the reference voltage Vref becomes the sum $VE_A+VE_C$, to thereby reduce the approximate 2nd-order coefficient with respect to the temperature.

In contrast, when the impurity concentration NE becomes lower than the impurity concentration ND due to the manufacturing variation, the effects of the approximate 2nd-order coefficient BE in FIG. 13 and the approximate 2nd-order coefficient BV in FIG. 3 based on the approximate 2nd-order coefficient BE becomes smaller. The reference voltage Vref exhibits a characteristic that draws an upwardly convex arc as indicated by Vref1 shown in FIG. 4. The fuse 12B connected in parallel to the enhancement NMOS transistor 11B which has a high channel impurity concentration and a large approximate 2nd-order coefficient is disconnected so that the reference voltage Vref becomes the sum $VE_A+VE_B$, to thereby reduce the approximate 2nd-order coefficient with respect to the temperature.

As described above, even though the channel impurity in the enhancement NMOS transistor 11A deviates from the setting value due to the manufacturing variation, any one of the enhancement NMOS transistors 11B and 11C is selected for combination by trimming the fuse depending on the direction of the deviation after the temperature characteristics are measured. As a result, the gradient index, in particular the approximate 2nd-order coefficient of the reference voltage Vref with respect to the temperature which is caused by the manufacturing variation of the channel impurity concentration can be reduced. Further, in the first embodiment, it is only required to prepare a plurality of enhancement NMOS transistors for manufacturing variation, and it is not required to prepare a plurality of unit reference voltage generation devices unlike Japanese Patent Application Laid-open No. 2014-186714, and accordingly downsizing of the reference voltage generation device can be achieved.

The description has been given of the case in which, in order to reduce the temperature-related variation of the reference voltage Vref caused by the manufacturing variation, the three enhancement NMOS transistors having the different impurity concentrations are provided in the voltage generation circuit, but the number of enhancement NMOS transistors is not particularly limited to three. For example, a combination of only two enhancement NMOS transistors, that is, an enhancement NMOS transistor including a channel impurity region having a high impurity concentration and an enhancement NMOS transistor including a channel impurity region having a low impurity concentration may be adopted. When the manufacturing variation of the impurity concentration does not occur, temperature characteristics of the enhancement NMOS transistors which are connected in series to each other may be combined to reduce the temperature-related variation of the reference voltage, and when the manufacturing variation of the impurity concentration occurs, one of the enhancement NMOS transistors can be adopted to reduce the temperature-related variation of the reference voltage.

Further, a plurality of enhancement NMOS transistors having the same impurity concentration NE may be provided in the voltage generation circuit. The temperature-related variation of the reference voltage Vref is determined by a balance between the temperature-related variation of the depletion NMOS transistor and the temperature-related variation of the enhancement NMOS transistors, and hence any combination may be adopted to achieve the balance. Further, changing the impurity concentrations of the enhancement NMOS transistors has been described above, but similar effects can be obtained when a plurality of depletion NMOS transistors having different impurity concentrations in the constant current circuit is prepared and trimmed.

As described above, the approximate 1st-order coefficient of the reference voltage with respect to the temperature is not particularly described in detail but can be adjusted by channel sizes (channel length and channel width) included in the mutual conductance such as KD in Expression (4) and KE in Expression (5). This method may be used together with the first embodiment to adjust the approximate 1st-order coefficient and the approximate 2nd-order coefficient of the reference voltage Vref with respect to the temperature, to thereby reduce the temperature-related variation.

Next, a description is given of a mechanism of the temperature-related variation based on the structures of the depletion NMOS transistor and the enhancement NMOS transistor.

Figure 5:
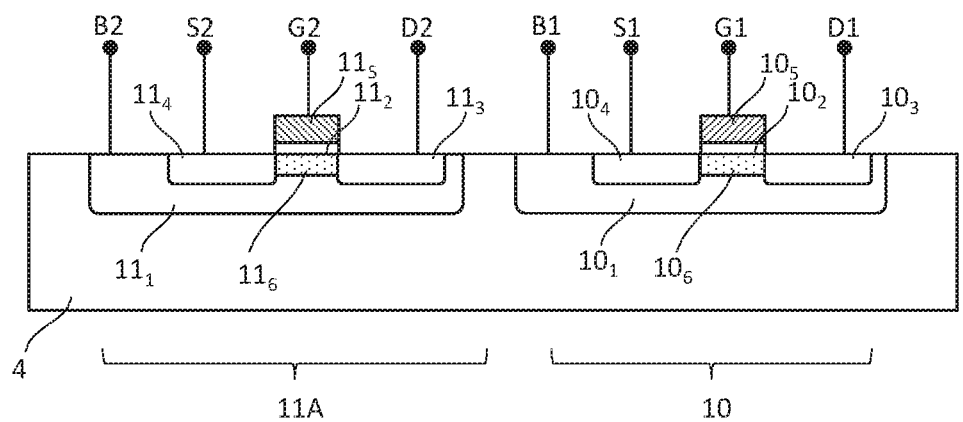
FIG. 5 is a schematic sectional view for illustrating the reference voltage generation device according to the first embodiment of the present invention.

FIG. 5 is a schematic sectional view for illustrating the structures of the depletion NMOS transistor 10 and the enhancement NMOS transistor 11A which form the reference voltage generation device 100 according to the first embodiment. Wire connection among terminals in the MOS transistors is omitted.

The depletion NMOS transistor 10 includes an N-type drain region $10_3$ and an N-type source region $10_4$ which are formed in a P-type well region $10_1$ in an N-type semiconductor substrate 4, an N-type channel impurity region $10_6$ which has an impurity concentration ND, a gate insulating film $10_2$ which is formed on the channel impurity region $10_6$, and an N-type gate electrode $10_5$ which is formed on the gate insulating film $10_2$.

The source region $10_4$ and the drain region $10_3$ contain high-concentration N-type impurities of $1\times10^{19}/cm^3$, or higher (the N-type polarity of the high concentration impurities is hereinafter referred to as "$N^+$-type:") and are connected to a source terminal S1 and a drain terminal D1, respectively. The gate electrode $10_5$ has a polarity of the $N^+$-type and is connected to a gate terminal G1. The impurity concentration ND is from $5\times10^{16}/cm^3$ to $1\times10^{18}/cm^3$.

The impurity concentration ND is higher than the P-type impurity concentration of the P-type well region $10_1$, and hence the channel impurity region $10_6$ becomes the N-type. Accordingly, even though a potential of the gate terminal G1 is 0 V, a drain current flows from the drain terminal D1 to the source terminal S1 through the channel impurity region $10_6$ in response to application of a drain voltage. A back-gate terminal B1 is connected to the P-type well region $10_1$ through a region (not shown) containing a high-concentration P-type impurities.

The enhancement NMOS transistor 11A includes an N-type drain region $11_3$ and an N-type source region $11_4$ which are formed in a P-type well region $11_1$ in the N-type semiconductor substrate 4, an N-type channel impurity region $11_6$ which has an impurity concentration NE, a gate insulating film $11_2$ which is formed on the channel impurity region $11_6$, and a P-type gate electrode $11_5$ which is formed on the gate insulating film $11_2$, The source region $11_4$ and the drain region $11_3$ contain $N^+$-type impurities and are connected to a source terminal S2 and a drain terminal D2, respectively. A back-gate terminal B2 is connected to the P-type well region $11_1$ through a region (not shown) containing high-concentration P-type impurities.

The threshold voltages of the depletion NMOS transistor 10 and the enhancement NMOS transistor 11A are each affected by the difference between the Fermi levels of the gate electrode and the channel impurity region. The difference between the threshold voltages of the depletion NMOS transistor 10 and the enhancement NMOS transistor 11A which have the same structure except for the polarity of the gate electrode is hence determined by the difference between the Fermi levels of the two gate electrodes having different polarities. Since the reference voltage Vref based on the threshold voltages of the depletion NMOS transistor 10 and the enhancement NMOS transistor 11A and also the temperature-related variation of the reference voltage Vref are determined by the difference between the Fermi levels of the gate electrodes, the approximate 2nd-order coefficient with respect to the temperature which is strongly affected by the impurity concentrations of the channel impurity regions is reduced. Further, in the first embodiment, even though the impurity concentrations of the channel impurity regions of two NMOS transistors in the reference voltage generation device 100 differ due to the manufacturing variation to increase the temperature-related variation, in particular, the approximate 2nd-order coefficient of the reference voltage with respect to the temperature, the plurality of voltage generation circuits to which the fuses are provided in parallel may be trimmed to achieve the reduction in temperature-related variation of the reference voltage Vref.

Incidentally, it is assumed that the constant current ID supplied from the constant current circuit exhibits a tendency of monotonous increase with respect to the temperature as shown in FIG. 2, and that the output voltage $VE_A$ provided from the voltage generation circuit exhibits a tendency of monotonous decrease with respect to the temperature as shown in FIG. 3. However, since the constant current ID expressed by Expression (4) is also affected by the temperature dependency of KD, the gradient with respect to the temperature may be negative depending on design conditions. In that case, it is designed to adjust the channel sizes included in the mutual conductance KD and KE so that the output voltage $VE_A$ has a positive gradient with respect to the temperature. In any case, in order to reduce the temperature-related variation of the reference voltage provided form the reference voltage generation device, the constant current supplied from the constant current circuit has the correlation represented by the first gradient with respect to the temperature, and the output voltage provided from the voltage generation circuit has the correlation represented by the gradient that is inverse to the correlation represented by the first gradient with respect to the temperature.

Second Embodiment

In the first embodiment, the description has been given of the reduction of the temperature-related variation of the reference voltage provided from the reference voltage generation device formed of the combination of NMOS transistors including the gate electrodes of different polarities. A reference voltage generation device according to the second embodiment of the present invention is made to reduce temperature-related variation of a reference voltage in a reference voltage generation device formed of a combination of NMOS transistors including gate electrodes of a single polarity, such as an N-type or a P-type.

Figure 6:
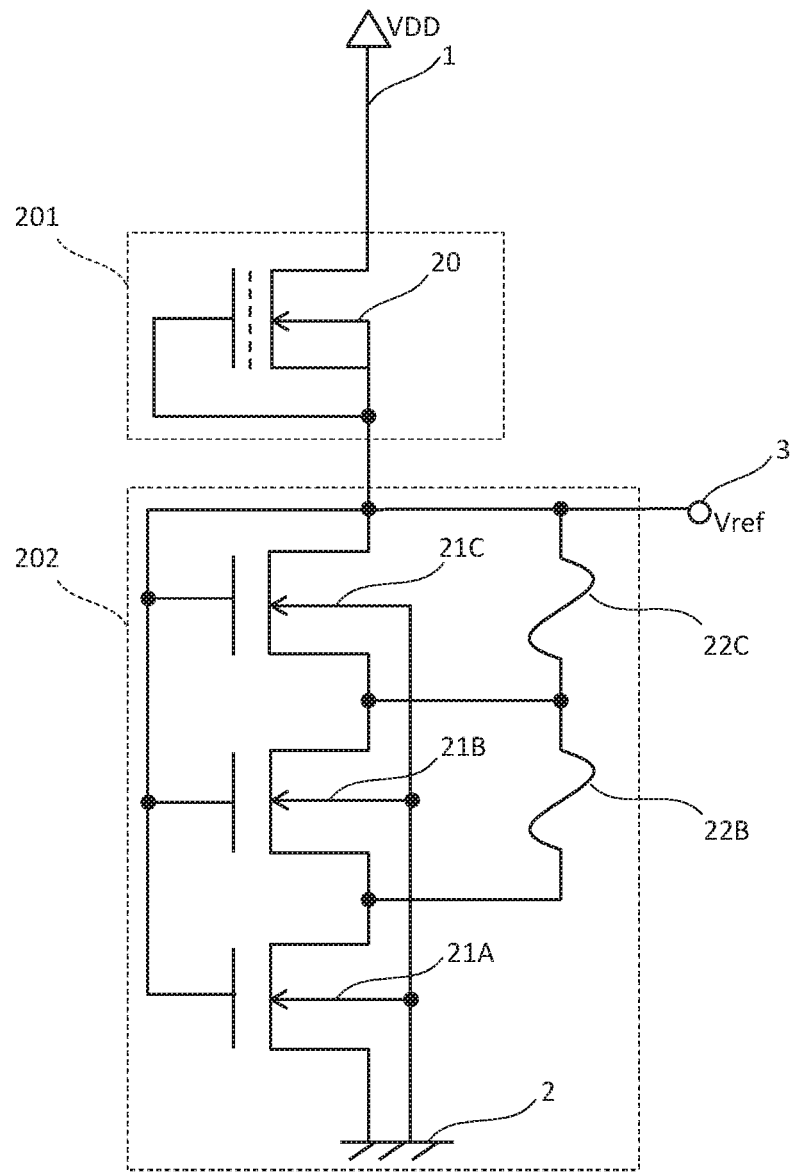
FIG. 6 is a circuit diagram for illustrating a reference voltage generation device according to a second embodiment of the present invention.

FIG. 6 is a circuit diagram for illustrating a reference voltage generation device 200 according to the second embodiment of the present invention. The reference voltage generation device 200 according to the second embodiment is similar to the first embodiment in the following points: a constant current circuit 201 which is connected to a power supply terminal 1 and to which a power supply voltage VDD is supplied supplies a constant current that is independent of the power supply voltage VDD to a voltage generation circuit 202; and the voltage generation circuit 202 provides a reference voltage Vref based on a value of the constant current from the reference voltage terminal 3. The second embodiment also has no difference from the first embodiment in terms of wire connection of a depletion NMOS transistor 20 forming the constant current circuit 201, and enhancement NMOS transistors 21A, 21B, and 21C, and fuses 22B and 22C.

The second embodiment is different from the first embodiment in that the enhancement NMOS transistors 21A, 21B, and 21C have gate electrodes containing impurities of the same polarity as the depletion NMOS transistor 20, and channel impurity regions containing impurities of different polarity from the depletion NMOS transistor 20. In other words, the depletion NMOS transistor 20 has an $N^+$-type gate electrode and an N-type channel impurity region, and the enhancement NMOS transistors 21A, 21B, and 21C each includes an $N^+$-type gate electrode and a P-type channel impurity region. The difference between threshold. voltages of the depletion NMOS transistor and the enhancement NMOS transistor in the second embodiment comes from differences in polarity and impurity concentration of the channel impurity regions.

Figure 7:
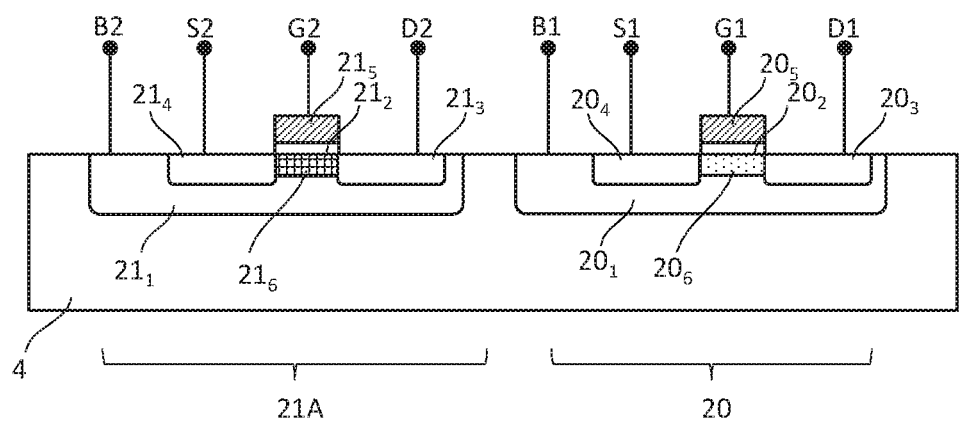
FIG. 7 is a schematic sectional view for illustrating the reference voltage generation device according to the second embodiment of the present invention.

FIG. 7 is a schematic sectional view for illustrating the structures of the depletion NMOS transistor 20 and the enhancement NMOS transistor 21A which form the reference voltage generation device 200 according to the second embodiment. Wire connection among the terminals G1, G2, D1, D2, S1, S2, B1, and B2 of the MOS transistors is omitted.

As in the first embodiment, the depletion NMOS transistor 20 has a P-type well region $20_1$ in an N-type semiconductor substrate 4, an $N^+$-type drain region $20_3$, an $N^+$-type source region $20_4$, an N-type channel impurity region $20_6$ having an impurity concentration ND of from $5\times10^{16}/cm^3$ to $1\times10^{18}/cm^3$, a gate insulating film $20_2$, and an $N^+$-type gate electrode $20_5$.

The enhancement NMOS transistor 21A is similar to the first embodiment in terms of a P-type well region $21_1$ in the N-type semiconductor substrate 4, an N$^+$-type drain region $21_3$, an N$^+$-type source region $21_4$, and a gate insulating film $21_2$. Meanwhile, a channel impurity region $21_6$ is made of P-type impurities having an impurity concentration NE of from $5\times10^{16}/cm^3$ to $1\times10^{18}/cm^3$, which is substantially the same impurity concentration as the impurity concentration ND. A gate electrode $21_5$ also has the same N$^+$-type impurities as the gate electrode $20_5$ of the depletion NMOS transistor 20. The enhancement NMOS transistors 21A, 21B, and 21C include channel impurity regions having different impurity concentrations, and output voltages provided from drains of the enhancement NMOS transistors 21A, 21B, and 21C all have correlations represented by a gradient that is inverse to ID with respect to the temperature, but have different gradient indices. Specifically, as compared to the impurity concentration of the channel impurity region of the enhancement NMOS transistor 21A, the impurity concentration of the channel impurity region of the enhancement NMOS transistor 21B is higher, and the impurity concentration of the channel impurity region of the enhancement NMOS transistor 21C is lower.

Incidentally, when the N-type channel impurity region of the depletion NMOS transistor is formed in the P-type well region, the N-type channel impurity region is often formed of impurities of a concentration that is at least a half digit higher than the impurity concentration of the P-type well region in order to stably maintain the impurity concentration ND. In the related art, the impurity concentration ND has accordingly tended to be higher than the impurity concentration NE of the enhancement NMOS transistor which includes the gate electrode of the same polarity and is formed similarly in the P-type well region. However, as described above, the approximate 2nd-order coefficients of the threshold voltage which are represented by BE and BD as shown in FIG. 13 with respect to the temperature are dependent on the impurity concentrations of the channel impurity regions. Therefore, the approximate 2nd-order coefficient of the threshold voltage of the depletion NMOS transistor which has the impurity concentration ND that is higher than the impurity concentration NE with respect to the temperature has been larger than the approximate 2nd-order coefficient of the threshold voltage of the enhancement NMOS transistor with respect to the temperature. As a result, the reference voltage Vref has tended to draw an upwardly convex arc with respect to the temperature as shown in FIG. 14. In the second embodiment, the impurity concentration NE is set to be higher than in the related art, and the impurity concentrations ND and NE are set to be substantially the same in order that the approximate 2nd-order coefficients of the threshold voltages of two NMOS transistors with respect to the temperature match.

The reference voltage Vref provided from the reference voltage generation device 200 including the depletion NMOS transistor 20 and the enhancement NMOS transistor 21A which include the gate electrodes of the same polarity and the channel impurity regions having the same impurity concentration shows a characteristic of the reduced temperature-related variation with respect to the temperature as indicated by Vref0 in FIG. 4. In the second embodiment, the temperature-related variation of the reference voltage Vref which is caused by the variation of the impurity concentration of the channel impurity region in the reference voltage generation device 200 is also reduced by state change of the fuses 22B and 22C as in the first embodiment.

In other words, when the impurity concentration NE becomes higher than the impurity concentration ND, the fuse 22C connected in parallel to the enhancement NMOS transistor 21C which includes the channel impurity region having the impurity concentration that is lower than NE is disconnected. As a result, the approximate 2nd-order coefficient of the reference voltage Vref with respect to the temperature is reduced to make the temperature-related variation that draws the downwardly convex arc with respect to the temperature as indicated by Vref2 of FIG. 4 closer to the tendency of Vref0.

In contrast, when the impurity concentration NE becomes lower than the impurity concentration ND, the fuse 22B connected in parallel to the enhancement NMOS transistor 21B which includes the channel impurity region having the impurity concentration that is higher than NE is disconnected. As a result, the temperature-related variation that draws the upwardly convex arc with respect to the temperature as indicated by Vref1 of FIG. 4 is also made closer to the tendency of Vref0.

In the second embodiment, the impurity concentration ND and the impurity concentration NE are set to be substantially the same, to thereby reduce the approximate 2nd-order coefficient of the reference voltage Vref provided from the reference voltage generation device 200 with respect to the temperature. Further, in the second embodiment, even though the impurity concentrations ND and NE differ due to the manufacturing variation to increase the approximate 2nd-order coefficient of the reference voltage Vref with respect to the temperature, a plurality of voltage generation circuits to which the fuses are provided in parallel can be trimmed to reduce the temperature-related variation of the reference voltage Vref. The reference voltage generation device 200 according to the second embodiment can be achieved with gate electrodes of one polarity without forming gate electrodes of two polarities, and hence the manufacturing steps can be easily simplified as compared to the first embodiment.

Further, the approximate 1st-order coefficient of the reference voltage with respect to the temperature can be adjusted by channel sizes included in the mutual conductance such as KD in Expression (4) and KE in Expression (5) as described above, and may be used together with the second embodiment.

Third Embodiment

The technology for adjusting the approximate 2nd-order coefficient of the reference voltage with respect to the temperature has been described above. A reference voltage generation device according to a third embodiment of the present invention is configured to reduce, in temperature-related variation of a reference voltage, fluctuations of an approximate 1st-order coefficient caused by variations of impurity concentrations.

Figure 8:
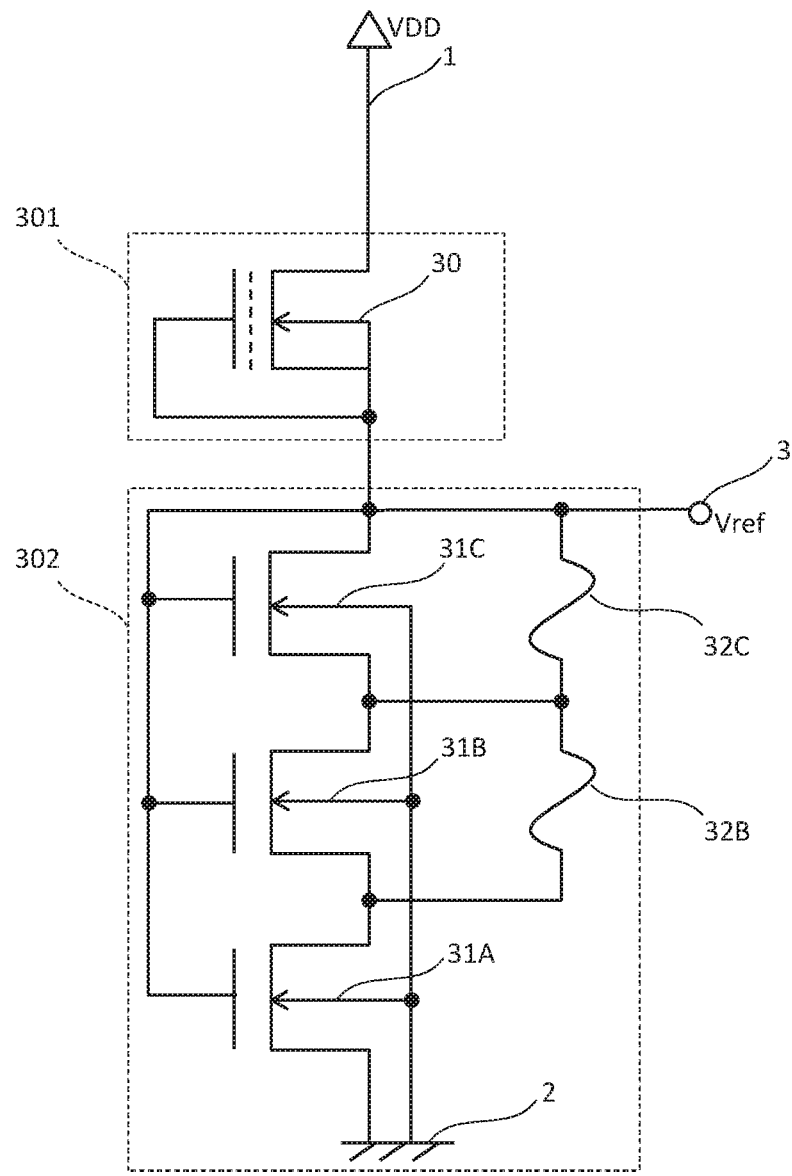
FIG. 8 is a circuit diagram for illustrating a reference voltage generation device according to a third embodiment of the present invention.

FIG. 8 is a circuit diagram for illustrating a reference voltage generation device 300 according to the third embodiment of the present invention. The reference voltage generation device 300 according to the third embodiment is similar to the first embodiment in the following points: a constant current circuit 301 which is connected to the power supply terminal 1 and to which the power supply voltage VDD is supplied supplies a constant current that is independent of the power supply voltage VDD to a voltage generation circuit 302; and the voltage generation circuit 302 provides a reference voltage Vref based on a value of the constant current from the reference voltage terminal 3. The third embodiment also has no difference from the first embodiment in terms of wire connection among a depletion NMOS transistor 30 forming the constant current circuit 301, enhancement NMOS transistors 31A, 31B, and 31C, and fuses 32B and 32C.

The third embodiment is different from the first embodiment in that gate electrodes of the enhancement NMOS transistors 31A, 31B, and 31C which form the voltage generation circuit 302 have a different polarity from the depletion NMOS transistor 30, and further have different impurity concentrations. In other words, a constant current supplied from the depletion NMOS transistor including an $N^+$-type gate electrode has a predetermined approximate 1st-order coefficient with respect to the temperature, while output voltages provided from the enhancement NMOS transistors 31A, 31B, and 31C including P-type gate electrodes having different impurity concentrations have approximate 1st-order coefficients having a slope that is inverse to the predetermined approximate 1st-order coefficient and having different values. Even though the approximate 1st-order coefficient of the reference voltage with respect to the temperature changes due to the manufacturing variation, at least one enhancement NMOS transistor is selected to function from the plurality of enhancement NMOS transistors, to thereby reduce the approximate 1st-order coefficient of the reference voltage Vref with respect to the temperature, and hence reduce the temperature-related variation.

Figure 9:
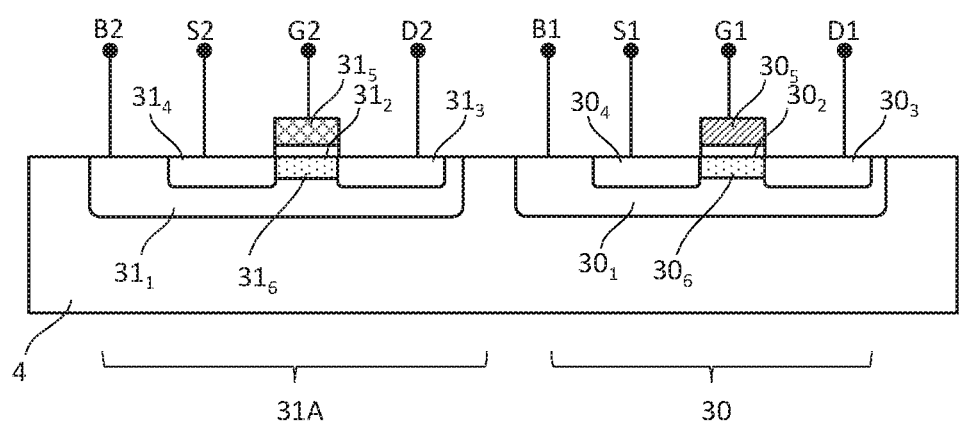
FIG. 9 is a schematic sectional view for illustrating the reference voltage generation device according to the third embodiment of the present invention.

FIG. 9 is a schematic sectional view for illustrating the structures of the depletion NMOS transistor 30 and the enhancement NMOS transistor 31A which form the reference voltage generation device 300 according to the third embodiment. Wire connection among the terminals GE G2, D1, D2, S1, S2, B1, and B2 of the MOS transistors is omitted.

The third embodiment is similar to the first embodiment in that the depletion NMOS transistor 30 includes a P-type well region $30_1$ in an N-type semiconductor substrate 4, an $N^+$-type drain region $30_3$, an $N^+$-type source region $30_4$, an N-type channel impurity region $30_6$ having an impurity concentration ND of from $5 \times 10^{16}/cm^3$ to $1 \times 10^{18}/cm^3$, and a gate insulating film $30_2$. The third embodiment is also similar to the first embodiment in that the enhancement NMOS transistor 31A includes a P-type well region $31_1$ in the N-type semiconductor substrate 4, an $N^+$-type drain region $31_3$, an $N^+$-type source region $31_4$, an N-type channel impurity region $31_6$ having an impurity concentration NE of from $5 \times 10^{16}/cm^3$ to $1 \times 10^{18}/cm^3$, and a gate insulating film $31_2$.

Meanwhile, as opposed to the first embodiment, impurity concentrations of channel impurity regions of the enhancement NMOS transistors 31B and 31C are all substantially the same as the impurity concentration NE of the channel impurity region of the enhancement NMOS transistor 31A. Further, a gate electrode $30_5$ of the depletion NMOS transistor 30 has N-type impurities having an impurity concentration of about $1 \times 10^{20}/cm^3$, but a gate electrode $31_5$ of the enhancement NMOS transistor 31A has P-type impurities having an impurity concentration of about $1 \times 10^{19}/cm^3$, for example. A gate electrode of the enhancement NMOS transistor 31B in FIG. 8 has an impurity concentration that is higher than the impurity concentration of the gate electrode of the enhancement NMOS transistor 31A and has P-type impurities having an impurity concentration of about $1 \times 10^{20}/cm^3$, for example. Further, a gate electrode of the enhancement NMOS transistor 31C has an impurity concentration that is lower than the impurity concentration of the gate electrode of the enhancement NMOS transistor 31A and has P-type impurities of an impurity concentration of about $1 \times 10^{18}/cm^3$, for example.

Next, a description is given of change of an approximate 1st-order coefficient of a reference voltage Vref provided from the reference voltage generation device 300 according to the third embodiment with respect to the temperature.

In general, a semiconductor doped by impurities has a Fermi level based on the impurity concentration, but when excitation of electrons from a valence band to a conduction band increases due to an increase in temperature, the Fermi level changes to approach the intrinsic Fermi level. The Fermi levels of the $N^+$-type gate electrode $30_5$ and the P-type gate electrode $31_5$ of FIG. 9 also change in a direction to approach the intrinsic Fermi level with the increase in temperature. Thus, the threshold voltage of the depletion NMOS transistor 30 including the N-type gate electrode $30_5$ increases, and the threshold voltage of the enhancement NMOS transistor 31A including the P-type gate electrode $31_5$ decreases. As a result, the reference voltage Vref output by the reference voltage generation device 300 of FIG. 8 changes to decrease with the increase in temperature unless the channel sizes and the like are adjusted. It should be noted, however, that in this case, unlike the tendency of the Fermi level of the channel impurity region, the approximate 2nd-order coefficient is small enough to be negligible with respect to the approximate 1st-order coefficient with respect to the temperature. It is considered that the reason why the approximate 2nd-order coefficient is dominant in the temperature tendency of the Fermi level of the channel impurity region is that, from a surface of the semiconductor substrate toward a depth direction, concentration fluctuation become larger and the Fermi level decreases accordingly, and hence the temperature-related variation of the Fermi level is also affected by the concentration fluctuations. Meanwhile, it is considered that the reason why the approximate 1st-order coefficient is dominant with respect to the temperature in the Fermi level of the gate electrode is that, with the impurities being uniformly distributed inside the gate electrode, the Fermi level experiences the temperature-related variation in a quasilinear state respect to the temperature.

The third embodiment uses the above-mentioned characteristics, and variation of the approximate 1st-order coefficient of the reference voltage Vref with respect to the temperature caused, for example, by the effects of the variations of the impurity concentration of the gate electrode is reduced by at least one enhancement NMOS transistor selected from the plurality of enhancement NMOS transistors to function. For example, when the impurity concentration of the gate electrode of the enhancement NMOS transistor 31A becomes higher, a fuse 32C connected in parallel to the enhancement NMOS transistor 31C is disconnected. As a result, the approximate 1st-order coefficient of the reference voltage Vref with respect to the temperature is prevented from shifting in a positive direction. Further, when the impurity concentration of the gate electrode of the enhancement NMOS transistor 31A becomes lower, a fuse 32B connected in parallel to the enhancement NMOS transistor 31B is disconnected. As a result, the approximate 1st-order coefficient of the reference voltage Vref with respect to the temperature is prevented from shifting in a negative direction.

In the reference voltage generation device according to the third embodiment, calibration of the mutual conductance of the NMOS transistor can be eliminated for adjustment of the approximate 1st-order coefficient of the reference voltage with respect to the temperature. It is not required to mount an NMOS transistor having an excessively large channel size in order to adjust the approximate 1st-order coefficient. Further, the adjustment of the approximate 1st-order coefficient can also be controlled by the amount of impurities implanted in the gate electrode in the manufacturing step, with the result that complicatedness of a design change and reproduction can be reduced.

In the third embodiment, the impurity concentrations of the gate electrodes of the plurality of enhancement NMOS transistors forming the voltage generation circuit are changed, but in order to reduce the temperature-related variation of the reference voltage, not only the impurity concentrations but also the polarity of the impurity may be changed.

The present invention is not limited to the above-mentioned embodiments, and it is to be understood that various modifications and combinations thereof are possible without departing from the gist of the present invention.

Figure 10:
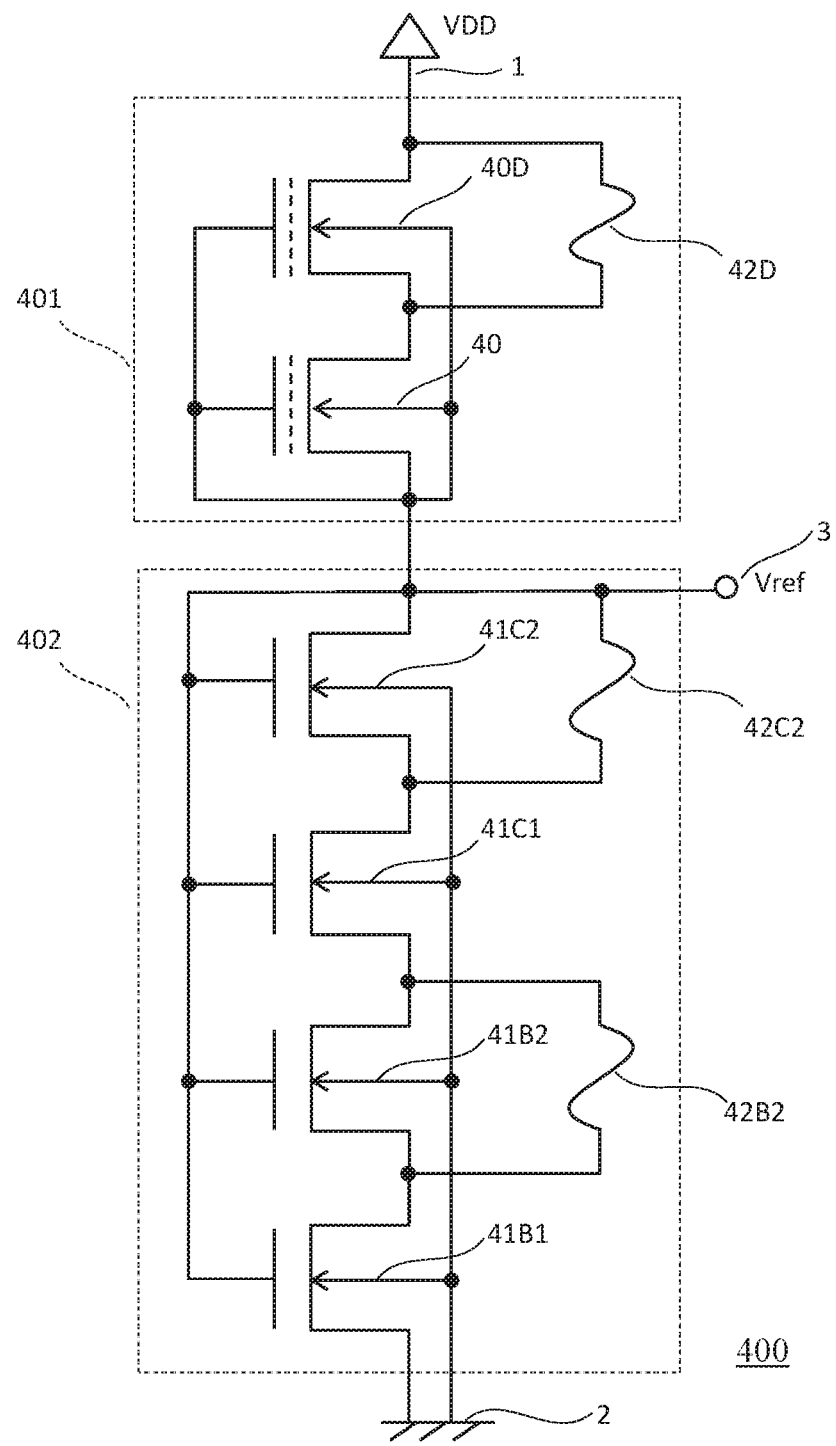
FIG. 10 is a circuit diagram for illustrating a modification example of the reference voltage generation device according to the first embodiment.

FIG. 10 is a circuit diagram for illustrating a reference voltage generation device 400 which is a modification example of the first embodiment, and which includes two depletion NMOS transistors including channel impurity regions having the same impurity concentration, and two enhancement NMOS transistors including channel impurity regions having different impurity concentrations. The temperature-related variation of the reference voltage output by the reference voltage generation device 400 can be reduced by adjusting the approximate 2nd-order coefficient through selection of the enhancement NMOS transistors including the channel impurity regions having different impurity concentrations, and by adjusting the approximate 1st-order coefficient through selection of the number of depletion NMOS transistors or enhancement NMOS transistors having the same impurity concentration.

A constant current circuit 401 includes depletion NMOS transistors 40 and 40D including channel impurity regions having the same impurity concentration. A fuse 42D is connected in parallel to the depletion NMOS transistor 40D, and when the fuse 42D is disconnected, the depletion NMOS transistors 40 and 40D forming the constant current circuit 401 are connected in series to function as a circuit. Then, the depletion NMOS transistors forming the constant current circuit 401 become substantially equivalent to an NMOS transistor obtained by adding channel lengths of the depletion NMOS transistor 40 and the depletion NMOS transistor 401) to each other. In other words, the depletion NMOS transistor 40D and the fuse 42D are provided to adjust the channel lengths of the depletion NMOS transistors forming the constant current circuit 401. The depletion NMOS transistors 40 and 40D may have different channel lengths or the same channel length.

A voltage generation circuit 402 includes enhancement NMOS transistors 41B1 and 41B2 each including a channel impurity region having a predetermined impurity concentration, and enhancement NMOS transistors 41C1 and 41C2 each including a channel impurity region having an impurity concentration that is different from the predetermined concentration. The impurity concentration of the channel impurity region of each of the enhancement NMOS transistors 41B1 and 41B2 is higher than the impurity concentration of the channel impurity region of each of the enhancement NMOS transistors 41C1 and 41C2. Each of the combination of the enhancement NMOS transistors 41B1 and 41B2 and the combination of the enhancement NMOS transistors 41C1 and 41C2 may have different channel lengths or the same channel length. As in the case of the constant current circuit 401, fuses 42B2 and 42C2 are connected in parallel to the enhancement NMOS transistors 41B2 and 41C2, respectively. Through disconnection of the fuses 42B2 and 42C2, the channel lengths of the depletion NMOS transistors each including the channel impurity region having the impurity concentration can be increased in an equivalent manner.

In the reference voltage generation device 400 having the above-mentioned configuration, through selection of connection of the fuse 42B2, the fuse 42C2, and the fuse 42D, substantial adjustment of the channel lengths of the depletion NMOS transistors and the enhancement NMOS transistors, and adjustment of impurity concentrations of the channel impurity regions of the enhancement NMOS transistors can be achieved. As a result, the approximate 1st-order coefficient and the approximate 2nd-order coefficient in the temperature-related variation of the reference voltage Vref can be adjusted finely and suitably.

Further, in the temperature-related variation of the reference voltage, the adjustment of the approximate 2nd-order coefficient with respect to the temperature has been described in the first embodiment and the second. embodiment, and the adjustment of the approximate 1st-order coefficient with respect to the temperature has been described in the third embodiment. The reference voltage generation device may have a configuration in which the first, second, and third embodiments are combined as appropriate to adjust the approximate 1st-order coefficient and the approximate 2nd-order coefficient.

Further, the channel impurity concentration of the enhancement NMOS transistors in the voltage generation circuit 402 may be obtained in the same step as the channel impurity regions used in a digital circuit or the like mounted on the same semiconductor integrated circuit. In this manner, even though the voltage generation circuit 402 includes the channel impurity regions set to have a plurality of impurity concentrations, an increase in the number of manufacturing steps can be suppressed.

Further, while the depletion NMOS transistor 10 in which the gate and the source are connected by a wire and the gate-source voltage VG is 0 V is used as the constant current circuit 101 included in the reference voltage generation device 100 of FIG. 1, the gate-source voltage VG is not required to be 0 V. In other words, the constant current circuit may employ a MOS transistor in which a constant voltage is applied to the gate to supply a constant current. Further, as long as a constant voltage is applied to the gate, it is not required for the MOS transistor forming the constant current circuit to be of the depletion type. Further, as long as similar functions are performed, a PMOS transistor may be used. Further, back gates of the depletion NMOS transistors 40 and 40D are not required to be connected to the reference voltage terminal 3, and may be connected to the ground terminal 2, for example. Further, the voltage generation circuit 102 forming the reference voltage generation device 100 of FIG. I often employs the enhancement type but may be of a depletion type.

In FIG. 5, the depletion NMOS transistor 10 and the enhancement NMOS transistor 11A are formed in separate P-type well regions $10_1$ and $11_1$ in the N-type semiconductor substrate 4. The depletion NMOS transistor 10 and the enhancement NMOS transistor 11A may also be formed in the same P-type well region, or in a P-type semiconductor substrate.

Figure 11:
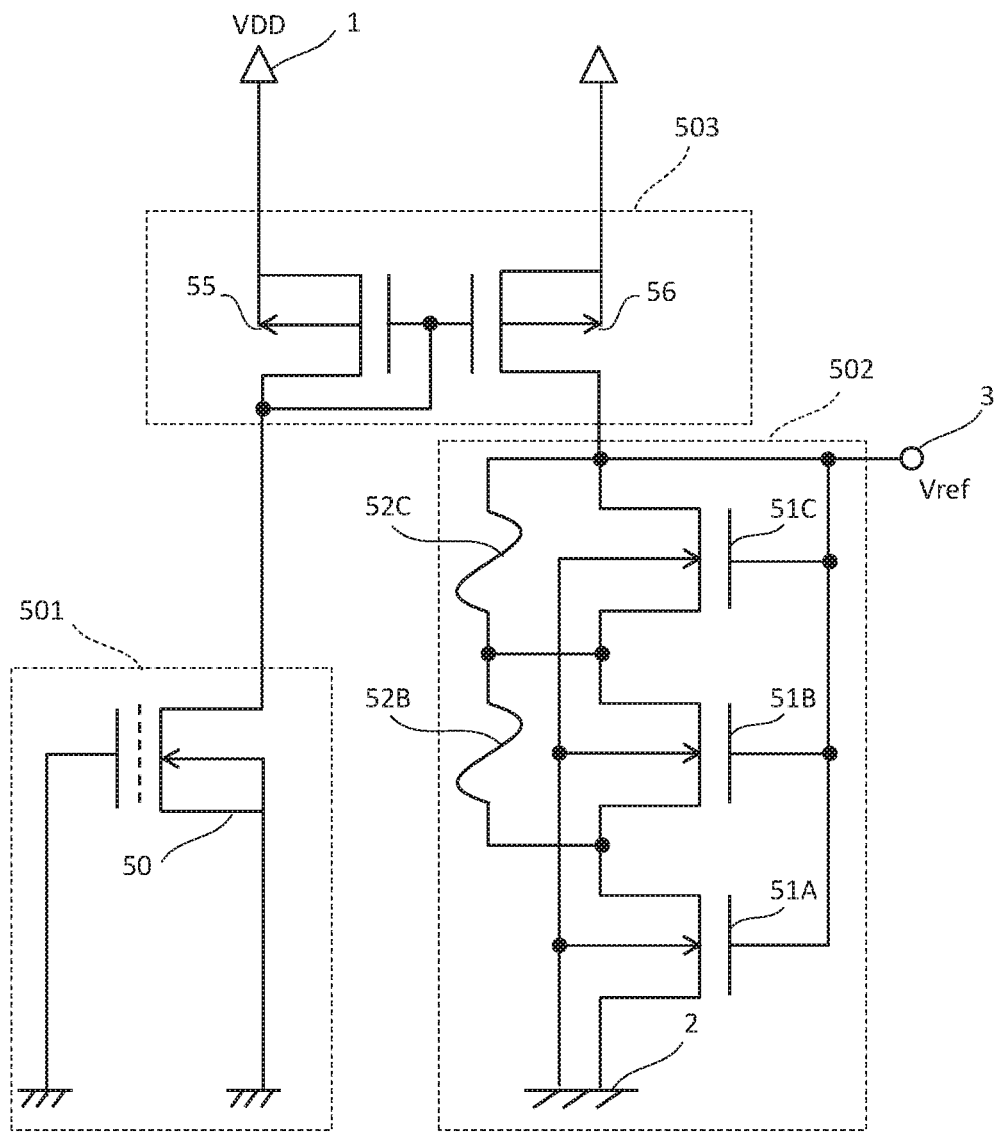
FIG. 11 is a circuit diagram for illustrating another modification example of the reference voltage generation device according to the first embodiment.

FIG. 11 is a circuit diagram for illustrating a reference voltage generation device 500 which is another modification example of the first embodiment, and which generates a reference voltage Vref without connecting a constant current circuit 501 and a voltage generation circuit 502 in series to each other. In this manner, a circuit configuration may be employed in which a constant current supplied from the constant current circuit 501 is provided to the voltage generation circuit 502 through a current mirror 503 formed by combining two PMOS transistors 55 and 56. This modification example is similar to the first embodiment in that enhancement NMOS transistors 51A, 51B, and 51C forming the voltage generation circuit 502 are connected in series to each other, and in that a fuse 52B and a fuse 52C are connected in parallel to the enhancement NMOS transistor 51B and the enhancement NMOS transistor 51C, respectively. Meanwhile, a gate, a source, and a back gate of a depletion NMOS transistor 50 forming the constant current circuit 501 are connected to the ground terminal 2. Hence, the reference voltage generation device of FIG. 11 can also be mounted on a P-type semiconductor substrate.

Further, as means for adjusting the temperature characteristics of the reference voltage Vref, there has been described the case in which the fuse that can be disconnected by laser and overcurrent is connected between the source and the drain of the MOS transistor, but an antifuse that can be connected by overcurrent may be adopted, for example. Further, the same effects can be obtained by connecting, instead of the fuses, a MOS transistor or other switch as an element capable of controlling state changes such as disconnection and short-circuit. Further, the same effects can be obtained by changing metal wirings with a photomask. The element connected in parallel to a NMOS transistor forming the voltage generation circuit and the method of the connection may be any element and method as long as the state changes such as short-circuit and disconnection can be made.

Further, as elements for adjusting the temperature-related variation of the reference voltage Vref, the polarities and the impurity concentrations of the gate electrodes of the enhancement NMOS transistors forming the voltage generation circuit, and the polarities and the impurity concentrations of the channel impurity regions have been described as an example, but there may be adopted a method in which thicknesses of the gate insulating films and the concentration of the P-type well region are changed. In other words, any element may be used as long as the gradient of the output voltage output by the voltage generation circuit with respect to the temperature has a correlation that is inverse to the gradient of the constant current supplied from the constant current circuit with respect to the temperature, and the gradient index is changed.

What is claimed is:

1. A reference voltage generation device, comprising:
    a constant current circuit configured to supply a constant current having a correlation represented by a first gradient with respect to a temperature change in response to an input voltage; and
    a plurality of voltage generation circuits, wherein each of the plurality of voltage generation circuits comprises at least one transistor, wherein the plurality of voltage generation circuits are configured to:
        generate a plurality of output voltages based on the constant current each having a correlation represented by a second gradient with respect to temperature change that is inverse to the correlation represented by the first gradient with respect to the temperature change; and
        generate the plurality of output voltages such that each one of the plurality of output voltages has a different gradient index from each other, wherein the gradient index is a combination of an approximate 1st-order coefficient and an approximate 2nd-order coefficient,
    wherein the reference voltage generation device is configured to generate a reference voltage based on the constant current and at least one output voltage of at least one voltage generation circuit selected from the plurality of voltage generation circuits.

2. The reference voltage generation device according to claim 1,
    wherein the plurality of voltage generation circuits includes a voltage generation circuit having a fuse connected in parallel, and
    wherein the output voltage is generated by at least one voltage generation circuit selected from the plurality of voltage generation circuits through a state change of the fuse.

3. The reference voltage generation device according to claim 1, wherein the constant current circuit includes a depletion MOS transistor configured to supply the constant current from a source based on the input voltage which is provided from a drain, and the plurality of voltage generation circuits includes enhancement MOS transistors each configured to supply the output voltage from a drain based on the constant current supplied from the drain.

4. The reference voltage generation device according to claim 3, wherein the plurality of voltage generation circuits includes enhancement MOS transistors including channel impurity regions having different impurity concentrations.

5. The reference voltage generation device according to claim 3, wherein the plurality of voltage generation circuits includes enhancement MOS transistors including gate electrodes having one of different polarities and different impurity concentrations.

6. The reference voltage generation device according to claim 3, wherein the plurality of voltage generation circuits includes enhancement MOS transistors having different channel sizes.

7. The reference voltage generation device according to claim 3, wherein the constant current circuit includes enhancement MOS transistors having a plurality of different channel sizes.

* * * * *